(12) United States Patent
Ueda et al.

(10) Patent No.: US 10,001,706 B2
(45) Date of Patent: Jun. 19, 2018

(54) EXTREME ULTRAVIOLET LIGHT GENERATION APPARATUS AND METHOD OF DESIGNING THE SAME

(71) Applicant: GIGAPHOTON INC., Tochigi (JP)

(72) Inventors: Atsushi Ueda, Oyama (JP); Shinji Nagai, Oyama (JP)

(73) Assignee: Gigaphoton Inc., Tochigi (JP)

( * ) Notice: Subject to any disclaimer, the term of this patent is extended or adjusted under 35 U.S.C. 154(b) by 0 days. days.

(21) Appl. No.: 15/651,259

(22) Filed: Jul. 17, 2017

(65) Prior Publication Data

US 2017/0315446 A1    Nov. 2, 2017

Related U.S. Application Data

(63) Continuation of application No. PCT/JP2015/059704, filed on Mar. 27, 2015.

(51) Int. Cl.
G03F 7/00 (2006.01)
G03F 7/20 (2006.01)
H05G 2/00 (2006.01)

(52) U.S. Cl.
CPC .......... *G03F 7/2008* (2013.01); *H05G 2/006* (2013.01)

(58) Field of Classification Search
CPC .......... H05G 2/00; H05G 2/001; H05G 2/003; H05G 2/005; H05G 2/006; H05G 2/008;
(Continued)

(56) References Cited

U.S. PATENT DOCUMENTS

2012/0086925 A1   4/2012   Kraus et al.
2012/0119116 A1   5/2012   Kakizaki et al.
(Continued)

FOREIGN PATENT DOCUMENTS

JP   2004-537157 A   12/2004
JP   2011-023712 A   2/2011
(Continued)

OTHER PUBLICATIONS

International Search Report issued in PCT/JP2015/059704; dated Jun. 16, 2015.
(Continued)

*Primary Examiner* — David E Smith
(74) *Attorney, Agent, or Firm* — Studebaker & Brackett PC

(57) ABSTRACT

An extreme ultraviolet light generation apparatus may include a chamber, a target supply device configured to successively supply targets into the chamber, and an extreme ultraviolet light collector mirror including a reflective surface having a through-hole at the center thereof. The reflective surface may reflect and collect extreme ultraviolet light generated at a predetermined emission cycle because of irradiation of the successively supplied targets with a laser beam. A gas ejection device may be disposed in the through-hole to jut out from the reflective surface and have a gas ejection opening to eject etching gas for debris onto the reflective surface. The gas ejection device may be configured so that the etching gas takes a longer time than the predetermined emission cycle to reach the through-hole-side end of effective reflective area of the reflective surface after being ejected from the gas ejection opening.

8 Claims, 12 Drawing Sheets

(58) Field of Classification Search
CPC . G03F 7/2008; G03F 7/70025; G03F 7/70033
See application file for complete search history.

(56) References Cited

U.S. PATENT DOCUMENTS

| | | | |
|---|---|---|---|
| 2012/0223257 A1* | 9/2012 | Nagai | G03F 7/70025 |
| | | | 250/504 R |
| 2013/0126761 A1* | 5/2013 | Nagai | H05G 2/005 |
| | | | 250/504 R |
| 2013/0161540 A1 | 6/2013 | Nagai et al. | |
| 2015/0282287 A1* | 10/2015 | De Dea | G03F 7/2039 |
| | | | 250/504 R |
| 2016/0143122 A1* | 5/2016 | Heo | H05G 2/008 |
| | | | 250/504 R |

FOREIGN PATENT DOCUMENTS

| | | |
|---|---|---|
| JP | 2012-523126 A | 9/2012 |
| JP | 2013-004369 A | 1/2013 |
| JP | 2013-109854 A | 6/2013 |
| JP | 2013-135033 A | 7/2013 |
| WO | 02/052347 A1 | 7/2002 |

OTHER PUBLICATIONS

Written Opinion issued in PCT/JP2015/059704; dated Jun. 16, 2015.

\* cited by examiner

COMPARATIVE EXAMPLE

COMPARATIVE EXAMPLE

COMPARATIVE EXAMPLE

COMPARATIVE EXAMPLE

COMPARATIVE EXAMPLE

COMPARATIVE EXAMPLE

| CLEANING UNNECESSARY DISTANCE C | PERCENTAGE OF CLEAN REFLECTIVE AREA |
|---|---|
| 1mm | 100% |
| 2mm | 99.98% |
| 3mm | 99.93% |
| 4mm | 99.86% |
| 5mm | 99.79% |
| 20mm | 98.16% |
| 40mm | 94.28% |

*FIG. 18*

EXTREME ULTRAVIOLET LIGHT GENERATION APPARATUS AND METHOD OF DESIGNING THE SAME

CROSS-REFERENCE TO RELATED APPLICATIONS

The present application is a continuation application of International Application No. PCT/JP2015/059704 filed on Mar. 27, 2015, the content of which is hereby incorporated by reference into this application.

BACKGROUND

1. Technical Field

The present disclosure relates to an extreme ultraviolet light generation apparatus and a method of designing the same.

2. Related Art

In recent years, semiconductor production processes have become capable of producing semiconductor devices with increasingly fine feature sizes, as photolithography has been making rapid progress toward finer fabrication. In the next generation of semiconductor production processes, microfabrication with feature sizes at 70 nm to 45 nm, and further, microfabrication with feature sizes of 32 nm or less will be required. In order to meet the demand for microfabrication with feature sizes of 32 nm or less, for example, the development of an exposure apparatus is expected in which a system for generating extreme ultraviolet (EUV) light at a wavelength of approximately 13 nm is combined with a reduced projection reflective optical system.

Three kinds of systems for generating EUV light are known in general, which include a Laser Produced Plasma (LPP) type system in which plasma is generated by irradiating a target material with a laser beam, a Discharge Produced Plasma (DPP) type system in which plasma is generated by electric discharge, and a Synchrotron Radiation (SR) type system in which orbital radiation is used to generate plasma.

SUMMARY

An extreme ultraviolet light generation apparatus according to an aspect of the disclosure may include a chamber, a target supply device configured to successively supply targets into the chamber, an extreme ultraviolet light collector mirror including a reflective surface having a through-hole at the center thereof, and a gas ejection device. The reflective surface may be configured to reflect and collect extreme ultraviolet light generated at a predetermined emission cycle because of irradiation of the successively supplied targets with a laser beam. The gas ejection device may be disposed in the through-hole to jut out from the reflective surface and have a gas ejection opening to eject etching gas for debris onto the reflective surface, the gas ejection device being configured so that the etching gas takes a longer time than the predetermined emission cycle to reach the through-hole-side end of effective reflective area of the reflective surface after being ejected from the gas ejection opening.

A method according an aspect of the disclosure may be a method for designing an extreme ultraviolet light generation apparatus including a gas ejection device disposed at a center of a reflective surface of an extreme ultraviolet light collector mirror and configured to eject etching gas for debris onto the reflective surface. The method may determine an emission cycle of extreme ultraviolet light. The method may determine an effective reflective area configured to reflect extreme ultraviolet light to be used for exposure, in the reflective surface. The method may determine a cleaning unnecessary distance from a gas ejection opening formed in the gas ejection device and configured to eject the etching gas onto the reflective surface to the effective reflective area. The method may determine a position for the gas ejection opening based on a time required for the etching gas to travel the cleaning unnecessary distance from the gas ejection opening and the emission cycle.

BRIEF DESCRIPTION OF THE DRAWINGS

Hereinafter, selected embodiments of the present disclosure will be described as mere examples with reference to the accompanying drawings.

FIG. 18 shows simulation results about the relation between the cleaning unnecessary distance from the gas ejection opening and the percentage of the clean reflective area with respect to the entire area of the reflective surface.

DETAILED DESCRIPTION

Figure 1:
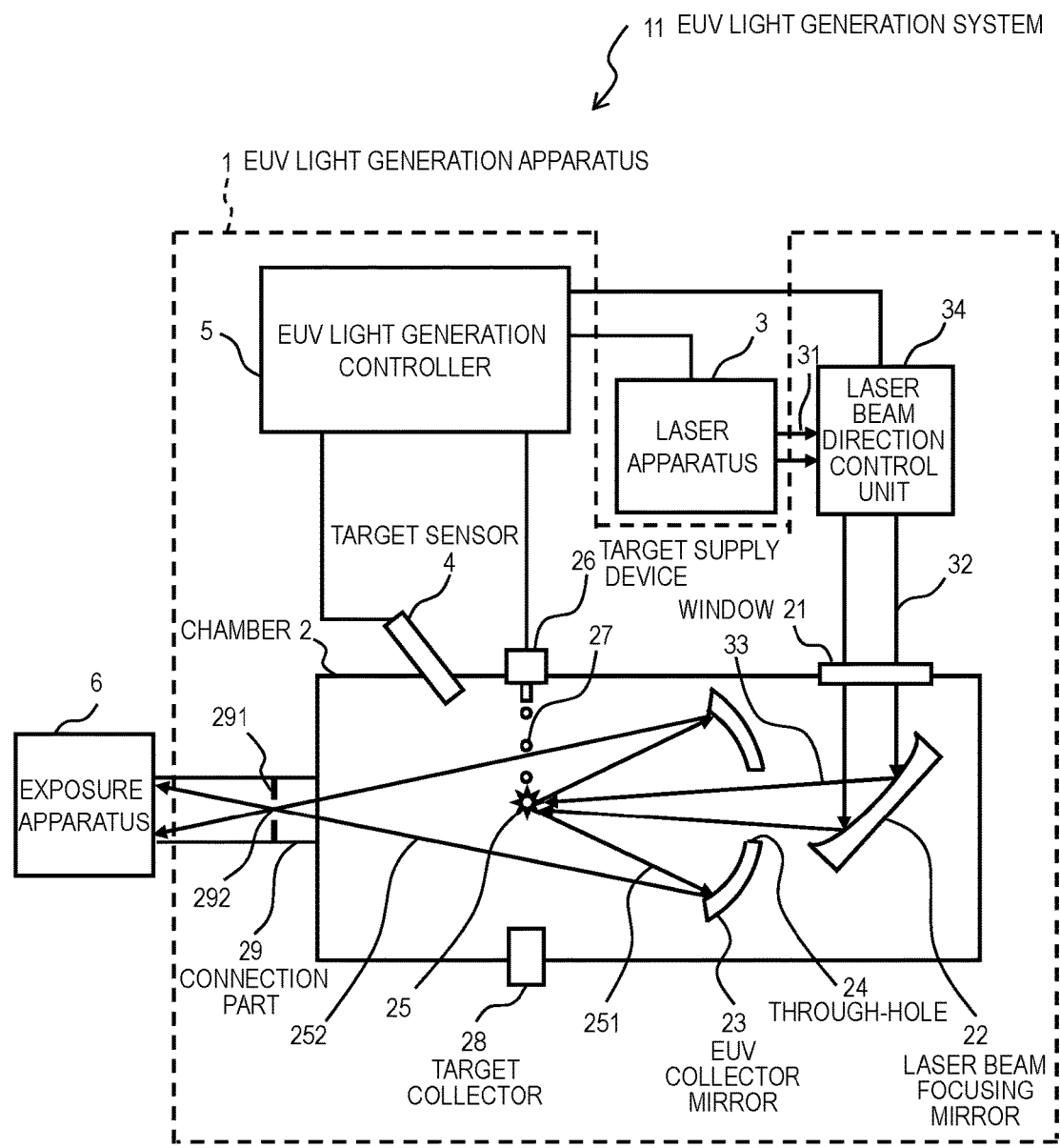
FIG. 1 schematically illustrates an exemplary configuration of an LPP type EUV light generation system.

<Contents>
1. Overview
2. Terms
3. Overview of EUV Light Generation System
   Configuration
   Operation
4. Comparative Example of EUV Light Generation Apparatus
   Configuration
   Operation
   Effects
   Issues
5. First Embodiment
   Configuration
   Effects
   Specific Examples
   Modified Examples
6. Second Embodiment Design Method Hereinafter, selected embodiments of the present disclosure will be described in detail with reference to the accompanying drawings. The embodiments to be described below are merely illustrative in nature and do not limit the scope of the present disclosure. Further, the configuration(s) and operation(s) described in each embodiment are not all essential in implementing the present disclosure. Note that like elements are referenced by like reference numerals and characters, and duplicate descriptions thereof will be omitted herein.

1. Overview

An LPP type EUV light generation apparatus may generate EUV light by irradiating a target outputted from a target supply device and output the generated EUV light to an exposure apparatus with an EUV light collector mirror. The EUV light generation apparatus may supply etching gas onto the surface of the EUV light collector mirror to prevent part of the target material from depositing on the EUV light collector mirror as debris. The etching gas may be radicalized by the EUV light and thereby increase the effect of etching.

If the gas flow over the surface of the EUV light collector mirror is inappropriate, some part of the surface of the EUV light collector mirror may suffer deposition of much debris. The reflectance of the part with much debris may drop significantly, so that the intensity distribution of the EUV light outputted to the exposure apparatus may become unsuitable for the exposure.

The extreme ultraviolet light generation apparatus of an example of the present disclosure may include a chamber, a target supply device, an extreme ultraviolet light collector mirror, and a gas ejection device. The target supply device may successively supply targets into the chamber. The extreme ultraviolet light collector mirror may have a reflective surface having a through-hole at the center thereof. The reflective surface may reflect and collect extreme ultraviolet light generated at a predetermined emission cycle because of irradiation of the successively supplied targets with a laser beam. The gas ejection device may be disposed in the through-hole to jut out from the reflective surface. The gas ejection device may have a gas ejection opening for ejecting etching gas for debris onto the reflective surface. The gas ejection device may be configured so that the etching gas takes a longer time than the predetermined emission cycle to reach the through-hole-side end of effective reflective area of the reflective surface after being ejected from the gas ejection opening. The foregoing configuration may achieve effective etching of the debris on the reflective surface of the EUV light collector mirror.

As another example of the present disclosure, a method of designing an EUV light generation apparatus is provided. The design method may determine the EUV light emission cycle. The method may further determine the effective reflective area to reflect the EUV light to be used for exposure in the reflective surface of the EUV light collector mirror and a cleaning unnecessary distance from the gas ejection opening for ejecting the etching gas onto the reflective surface to the effective reflective area. Furthermore, the method may determine the position for the gas ejection opening based on the time required for the etching gas to travel the cleaning unnecessary distance from the gas ejection opening and the EUV light emission cycle. This design method may produce a structure that achieves effective etching of the debris on the reflective surface of the EUV light collector mirror.

2. Terms

"Etching gas" is a gas to be used to etch the debris adherent to the surface of the EUV light collector mirror. In the example described hereinbelow, hydrogen gas and hydrogen radical gas generated from the hydrogen gas are etching gas. "Effective reflective area" is an area of the reflective surface of an EUV light collector mirror that reflects EUV light to be used by the exposure apparatus.

3. Overview of EUV Light Generation System

Configuration

FIG. 1 schematically illustrates an exemplary configuration of an LPP type EUV light generation system. An EUV light generation apparatus 1 may be used with at least one laser apparatus 3. Hereinafter, a system that includes the EUV light generation apparatus 1 and the laser apparatus 3 may be referred to as an EUV light generation system 11. As shown in FIG. 1 and described in detail below, the EUV light generation apparatus 1 may include a chamber 2 and a target supply device 26.

The chamber 2 may be sealed airtight. The target supply device 26 may be mounted onto a wall of the chamber 2 to penetrate the wall, for example. A target material to be supplied by the target supply device 26 may include, but is not limited to, tin, terbium, gadolinium, lithium, xenon, or any combination thereof.

The chamber 2 may have at least one through-hole formed in its wall. A window 21 may be installed to cover the through-hole and the pulse laser beam 32 outputted from the laser apparatus 3 may travel through the window 21. An EUV light collector mirror 23 having, for example, a spheroidal reflective surface may be provided in the chamber 2. The EUV light collector mirror 23 may have a first focal point and a second focal point.

The EUV light collector mirror 23 may have a multi-layered reflective film including alternately laminated molybdenum layers and silicon layers formed on the surface thereof. For example, the EUV light collector mirror 23 is preferably positioned such that the first focal point lies in a plasma generation region 25 and the second focal point lies at an intermediate focal point (IF) 292. The EUV light collector mirror 23 may have a through-hole 24 formed at the center thereof and a pulse laser beam 33 may travel through the through-hole 24.

The EUV light generation apparatus 1 may include an EUV light generation controller 5 and a target sensor 4, for example. The target sensor 4 may have an imaging function and detect at least one of the presence, trajectory, and position of a target.

Further, the EUV light generation apparatus 1 may include a connection part 29 for allowing the interior of the chamber 2 to be in communication with the interior of the exposure apparatus 6. A wall 291 having an aperture may be provided in the connection part 29. The wall 291 may be positioned such that the second focal point of the EUV light collector mirror 23 lies in the aperture.

The EUV light generation apparatus 1 may also include a laser beam direction control unit 34, a laser beam focusing mirror 22, and a target collector 28 for collecting targets 27. The laser beam direction control unit 34 may include an optical element for defining the travelling direction of the laser beam and an actuator for adjusting the position or the attitude of the optical element.

3.2 Operation

With reference to FIG. 1, a pulse laser beam 31 outputted from the laser apparatus 3 may pass through the laser beam direction control unit 34 and, as the pulse laser beam 32, travel through the window 21 and enter the chamber 2. The pulse laser beam 32 may travel inside the chamber 2 along at least one beam path, be reflected by the laser beam focusing mirror 22, and strike at least one target 27 as a pulse laser beam 33.

The target supply device 26 may be configured to output the target(s) 27 toward the plasma generation region 25 in the chamber 2. The target 27 may be irradiated with at least one pulse of the pulse laser beam 33. Upon being irradiated with the pulse laser beam, the target 27 may be turned into plasma, and radiated light 251 may be generated from the plasma.

EUV light 252 included in the radiated light 251 may be reflected and focused by the EUV light collector mirror 23. The EUV light 252 reflected by the EUV light collector mirror 23 may be focused on the intermediate focal point 292 and outputted to the exposure apparatus 6. Here, the target 27 may be irradiated with multiple pulses included in the pulse laser beam 33.

The EUV light generation controller 5 may be configured to integrally control the EUV light generation system 11. The EUV light generation controller 5 may be configured to process image data of the target 27 captured by the target sensor 4. The EUV light generation controller 5 may be configured to control at least one of: the timing when the target 27 is outputted and the direction into which the target 27 is outputted, for example.

The EUV light generation controller 5 may be configured to control at least one of: the timing when the laser apparatus 3 oscillates, the direction in which the pulse laser beam 32 travels, and the position at which the pulse laser beam 33 is focused, for example. It will be appreciated that the various controls mentioned above are merely examples, and other controls may be added as necessary.

4. Comparative Example of EUV Light Generation Apparatus

Configuration

Figure 2:
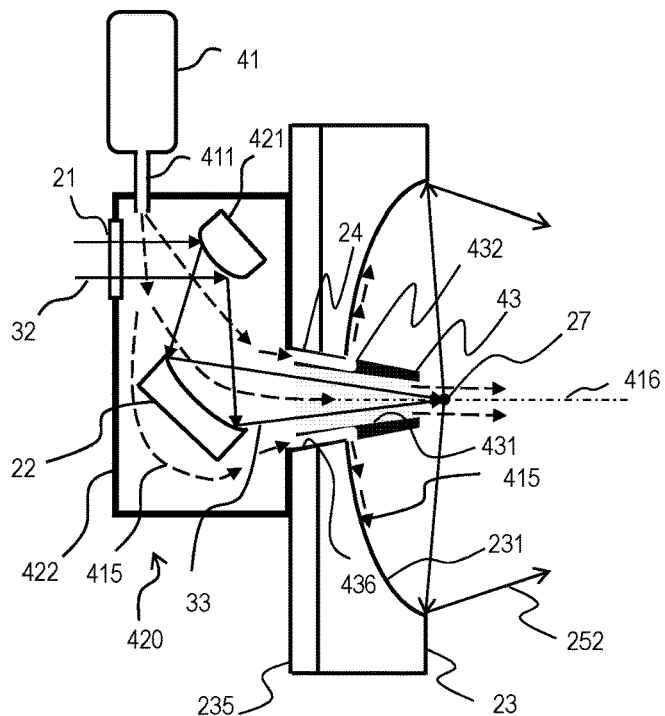
FIG. 2 is a cross-sectional diagram of a partial configuration of an EUV light generation apparatus of a comparative example.

FIG. 2 is a cross-sectional diagram of a partial configuration of an EUV light generation apparatus of a comparative example. The EUV light generation apparatus of the comparative example may include a laser beam focusing unit 420, a hydrogen gas source 41, a tube 411, a cone 43, a plate 235, and an EUV light collector mirror 23.

The plate 235 may hold the EUV light collector mirror 23 and the laser beam focusing unit 420. The EUV light collector mirror 23 may be held by a not-shown mount held adjustably in position and orientation by the plate 235. The EUV light collector mirror 23 may have a through-hole 24 at the center thereof as shown in FIG. 1. The through-hole 24 of the EUV light collector mirror 23 may be provided in the area not used for the exposure apparatus 6.

The laser beam focusing unit 420 may include a window 21, an off-axis parabolic convex mirror 421, a laser beam focusing mirror 22, and a casing 422. The laser beam focusing mirror 22 may be an oval concave mirror. The casing 422 may contain and enclose the off-axis parabolic convex mirror 421 and the laser beam focusing mirror 22 so that the mirrors 421 and 22 are isolated from the external air. The casing 422 may connect to the chamber 2 where EUV light is generated through the cone 43. The optical elements of the laser beam focusing unit 420 may be disposed in the order of the window 21, the off-axis parabolic convex mirror 421, and the laser beam focusing mirror 22 on and along the laser beam path.

The tube 411 may connect the hydrogen gas source 41 and the casing 422 to direct hydrogen gas 415 into the laser beam focusing unit 420. The hydrogen gas source 41 may contain hydrogen gas and output the hydrogen gas 415 into the tube 411 at a predetermined flow rate. The connection port between the tube 411 and the casing 422 may be provided at such a place that the hydrogen gas 415 flows on the surface of the window 21.

Figure 3A:
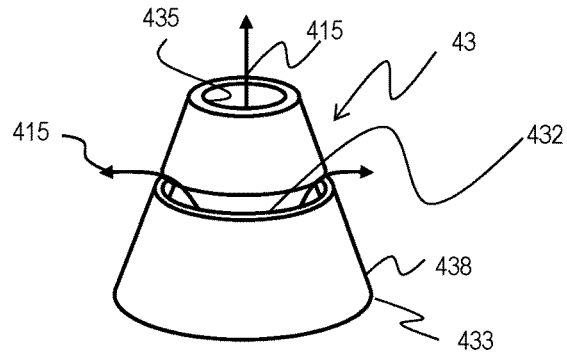
FIG. 3A illustrates a configuration example of a cone.
Figure 3B:
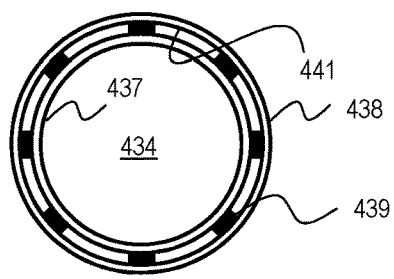
FIG. 3B illustrates a configuration example of a cone.

FIGS. 3A and 3B illustrate a configuration example of the cone 43, which is a hydrogen gas ejection device. FIG. 3A is a perspective view of the cone 43. FIG. 3B is a bottom view of FIG. 3A and shows the gas inflow end of the cone 43. The cone 43 may be a member shaped like a hollow cone. The cone 43 may have a wall 433 shaped like a cone surrounding a central through-hole 431.

The cone 43 may have a gas inlet 434 and a gas outlet 435 of the central through-hole 431. The cone 43 may be disposed to extend through the through-hole 24 of the EUV light collector mirror 23 in such a manner that the central axis of the cone 43 substantially matches the focal axis 416 of the EUV light collector mirror 23. The focal axis 416 may be the central axis of the EUV light collector mirror 23. The central axis of the cone 43 may extend through the laser irradiation point on a target 27 and the vicinity thereof. The wall 433 may have a gas channel 436 within the wall 433, for the hydrogen gas 415 to flow therethrough. The gas channel 436 may be provided between the inner wall 437 of the wall 433 and the outer wall 438 of the wall 433. The inner wall 437 and the outer wall 438 may be connected by a plurality of connectors 439 at the inflow end of the gas channel 436. The plurality of connectors 439 may be provided separately in the circumferential direction to form a plurality of gas inlets 441 of the gas channel 436.

The gas channel 436 may connect from the inside of the casing 422 of the laser beam focusing unit 420 through the plurality of gas inlets 441. The gas inlets 441 and the connectors 439 may be disposed alternately in the circumferential direction. The other end of the gas channel 436 may connect to the inside of the chamber 2 through a gas ejection opening 432.

The gas ejection opening 432 may be a slit extending in the circumferential direction of the outer surface of the wall 433. The gas ejection opening 432 may be provided so that the hydrogen gas 415 will flow over the reflective surface 231 of the EUV light collector mirror 23 radially from the central area of the reflective surface 231 toward the periphery.

Operation

A laser beam 32 may be directed into the laser beam focusing unit 420 through the window 21. The diameter of the laser beam 32 may be expanded by the off-axis parabolic convex mirror 421 and the laser beam 33 may be focused onto a droplet target 27 by the laser beam focusing mirror 22. When the target 27 is irradiated with the laser beam 33, the target 27 may turn into plasma and generate EUV light 252. Simultaneously, debris may be generated; the target material may adhere to the EUV light collector mirror 23.

Hydrogen gas 415 from the hydrogen gas source 41 may flow through the tube 411 and enter the laser beam focusing unit 420. The hydrogen gas 415 may flow on the surfaces of the optical elements of the laser beam focusing optical system in the laser beam focusing unit 420, specifically, the window 21, the off-axis parabolic convex mirror 421, and the laser beam focusing mirror 22. The hydrogen gas 415 that has passed through the laser beam focusing unit 420 may enter the chamber 2 through the cone 43.

The hydrogen gas 415 may flow in the central through-hole 431 from the gas inlet 434 of the cone 43 and enter the chamber 2 from the gas outlet 435. The hydrogen gas 415 may also flow in the gas channel 436 from the gas inlets 441 of the cone 43 and enter the chamber 2 from the gas ejection opening 432.

The gas ejection opening 432 may eject the hydrogen gas 415 toward the reflective surface 231 of the EUV light collector mirror 23. The hydrogen gas 415 ejected from the gas ejection opening 432 may flow over the reflective surface 231 of the EUV light collector mirror 23 radially from the center thereof.

The hydrogen gas 415 flowing over the reflective surface 231 of the EUV light collector mirror 23 may be radicalized by the EUV light 252, react to the debris deposited on the reflective surface 231, and generate gaseous stannane ($SnH_4$). The reaction formula may be $4H^* + Sn = SnH_4$. The stannane may be pumped out from the chamber 2 with a not-shown exhaust pump. The hydrogen gas and the hydrogen radical gas may be etching gas. In the present disclosure, the hydrogen gas and the hydrogen radical gas are both denoted by the same reference numeral 415 unless otherwise specified.

Effects

The hydrogen gas 415 flows over the reflective surface 231 of the EUV light collector mirror 23 radially from the center thereof; accordingly, the debris deposited on the reflective surface 231, if any, may be etched by the hydrogen radical gas 415 generated by the EUV light 252. The hydrogen gas 415 supplied from the central through-hole 431 of the cone 43 may hamper debris from entering the laser beam focusing unit 420 and prevent the debris from adhering to the off-axis parabolic convex mirror 421 and the laser beam focusing mirror 22. Under this configuration, the EUV light collector mirror 23 may be saved from degradation in reflectance caused by adhesion of debris and further, the off-axis parabolic convex mirror 421 and the laser beam focusing mirror 22 may also be saved from degradation in reflectance.

Issues

Under the configuration illustrated in FIGS. 2, 3A, and 3B, it may be expected that more hydrogen radical gas be generated in an area closer to the focal axis 416 of the EUV light collector mirror 23 because of the higher fluence of the EUV light. Accordingly, the etching rate for the debris deposited on the reflective surface 231 may also be expected to be high in the central area of the EUV light collector mirror 23, or the area closer to the focal axis 416.

However, analysis of experimental results revealed a fact different from the foregoing expectation. The inventors checked the amount of debris deposited on the EUV light collector mirror 23 after operating the EUV light generation apparatus 1. The inventors obtained a result that a large amount of debris is deposited on the vicinity of the center of the EUV light collector mirror 23 and the amount of deposited debris decreases with the distance from the mirror center.

Figure 4:
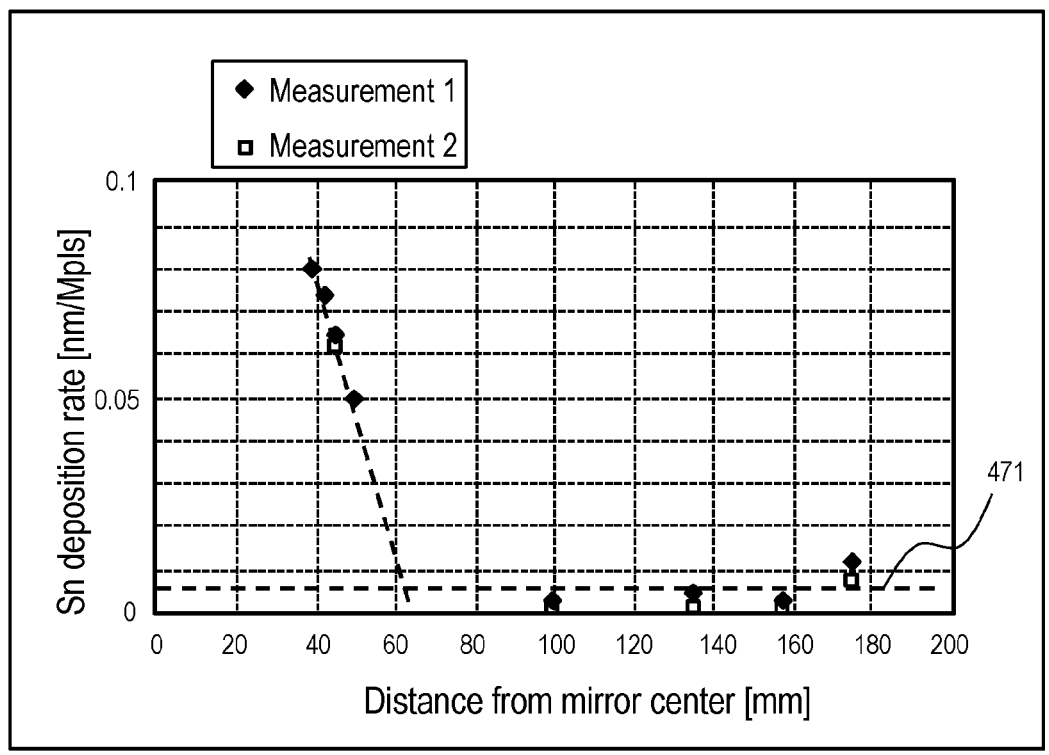
FIG. 4 shows experimental results obtained by the inventors. The horizontal axis represents the distance from the center of an EUV light collector mirror and the vertical axis represents the deposition rate of debris deposited on the reflective surface.

FIG. 4 shows experimental results obtained by the inventors. In the graph of FIG. 4, the horizontal axis represents the distance from the center of the EUV light collector mirror 23. The vertical axis represents the deposition rate of the debris deposited on the reflective surface 231. FIG. 4 shows results of two measurements: one is denoted by diamonds and the other is denoted by squares. The line 471 represents the lower limit of detection. FIG. 4 indicates that the etching works effectively in the peripheral area of the EUV light collector mirror 23 but does not work sufficiently in the central area of the EUV light collector mirror 23.

Figure 5:
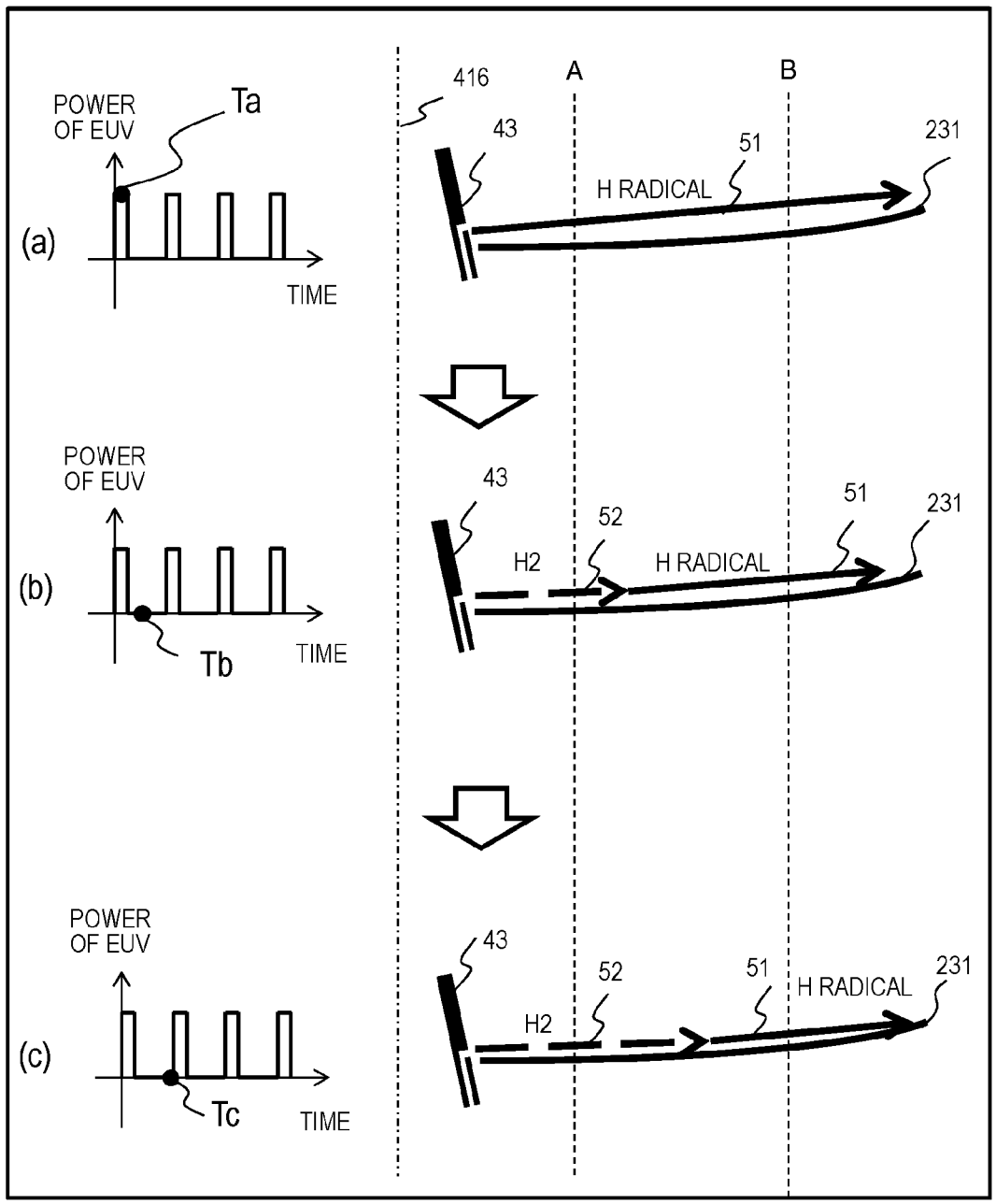
FIG. 5 illustrates a correspondence relation between the output timing of EUV light and the state of the gas on the reflective surface of the EUV light collector mirror in an EUV light generation apparatus of a comparative example.

This result may be interpreted as follows. FIG. 5 illustrates a correspondence relation between the output timing of EUV light and the state of the gas on the reflective surface 231 of the EUV light collector mirror 23 in an EUV light generation apparatus of a comparative example. FIG. 5 shows that the state changes from the top row (a) to the middle row (b), and further to the bottom row (c) with passage of time.

The top row (a) shows the state at a time Ta in outputting EUV light. At the time Ta, EUV light is being generated, so that hydrogen radical gas 51 may be generated by the EUV light all over the reflective surface 231 of the EUV light collector mirror 23. The entire surface of the reflective surface 231 of the EUV light collector mirror 23 may be subjected to the etching by the hydrogen radical gas 51.

The middle row (b) shows the state at a time Tb in outputting EUV light. At the time Tb, EUV light may not be generated. Since EUV light is pulses, stop of the EUV light may stop the generation of hydrogen radical gas as well. The flow of hydrogen gas 52 from the gas ejection opening 432 of the cone 43 may move the hydrogen radical gas 51 already generated on the reflective surface 231 toward the periphery of the reflective surface 231. Etching may progress at Point B in the peripheral area, for example. At Point A in the central area, however, hydrogen gas 52 that will not be radicalized may be provided, reducing the effect of the etching.

The bottom row (c) shows the state at a time Tc in outputting EUV light. At the time Tc, EUV light may not be generated yet. Hydrogen radical gas may not be generated in the central area of the reflective surface 231 until EUV light is generated again. Accordingly, the hydrogen gas 52 and the hydrogen radical gas 51 on the reflective surface 231 may further move toward the periphery of the reflective surface 231. For this reason, the effect of the etching at Point A may be small and the etching at Point B may progress further.

As described above, when the EUV light generation apparatus 1 is operating, the gas flow on the reflective surface 231 of the EUV light collector mirror 23 may repeat the states of the top row (a), the middle row (b), and the bottom row (c) of FIG. 5. As a result, hydrogen radical gas 51 may be supplied intermittently to the central area of the reflective surface 231 near the cone 43.

For this reason, it may be presumed that the effect of etching in the central area of the reflective surface 231 is weak, compared to the peripheral area. The degree of drop of the etching rate caused by the variation in supply of hydrogen radical gas in the central area of the reflective surface 231 may be affected by the velocity of the gas flow on the reflective surface 231 of the EUV light collector mirror 23 and the EUV light emission frequency.

Figure 6:
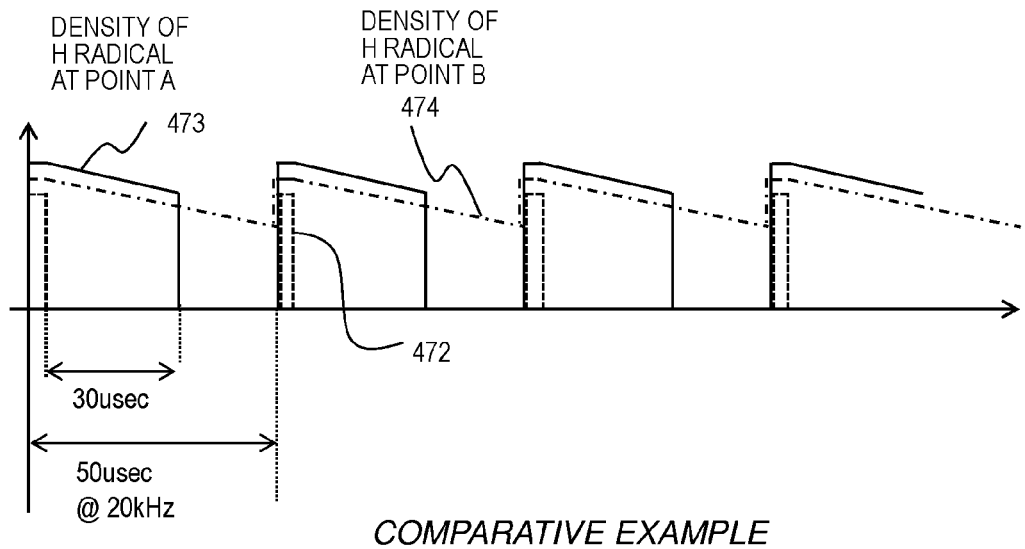
FIG. 6 illustrates correspondence relations between the density of hydrogen radical gas at Point A and Point B in FIG. 5 and the emission timing of EUV light.

FIG. 6 illustrates correspondence relations between the density of hydrogen radical gas at Point A and Point B in FIG. 5 and the emission timing of EUV light. In FIG. 6, the horizontal axis represents the time and the vertical axis represents the power of EUV light and the density of hydrogen radical gas. Specifically, the line 472 represents the variation in power of the EUV light; the line 473 represents the variation in density of hydrogen radical gas at Point A; and the line 474 represents the variation in density of hydrogen radical gas at Point B.

For example, in the case where the EUV light emission frequency is 20 kHz, the EUV light emission cycle may be 50 μs. Now, assume that the hydrogen gas ejected after emission of an EUV light pulse from the gas ejection opening 432 may take 30 μs to reach Point A in FIG. 5.

As shown in FIG. 6, the density of hydrogen radical gas at Point A may drop sharply as soon as the hydrogen gas ejected upon generation of EUV light from the gas ejection opening 432 reaches Point A. However, the density of hydrogen radical gas at Point B may be maintained at some level for 50 μs of the EUV light emission cycle.

The reason why the supply of hydrogen radical gas is intermittent at Point A, which is closer to the gas ejection opening 432 than Point B, may be presumed to be that the gas flows fast at Point A with respect to the EUV light emission cycle. It may be presumed that the gas-flow velocity is sufficiently slow at Point B but too fast at Point A. That is to say, achieving sufficiently slow gas-flow velocity at Point A may lead to effective etching of the debris.

The diameter of the EUV light collector mirror 23 may be approximately 200 to 700 mm and the pressure inside the chamber 2 may be kept low. For these reasons, the gas might diffuse before the hydrogen radical gas reaches the peripheral end of the reflective surface 231, if the gas-flow velocity is low. To remove the stannane to prevent adhesion of new debris, it may be preferable to provide unreacted hydrogen radical gas to the reflective surface 231. In consideration of these points, providing hydrogen radical gas flowing at a sufficient velocity onto the reflective surface 231 may be important.

Hence, described hereinafter is a configuration of an EUV light generation apparatus that supplies hydrogen radical gas to the substantial reflective area of the reflective surface 231 not intermittently but continuously, while maintaining the gas flow at a velocity for effective etching on the substantial reflective area and a method of designing such an EUV light generation apparatus.

5. First Embodiment

Figure 7:
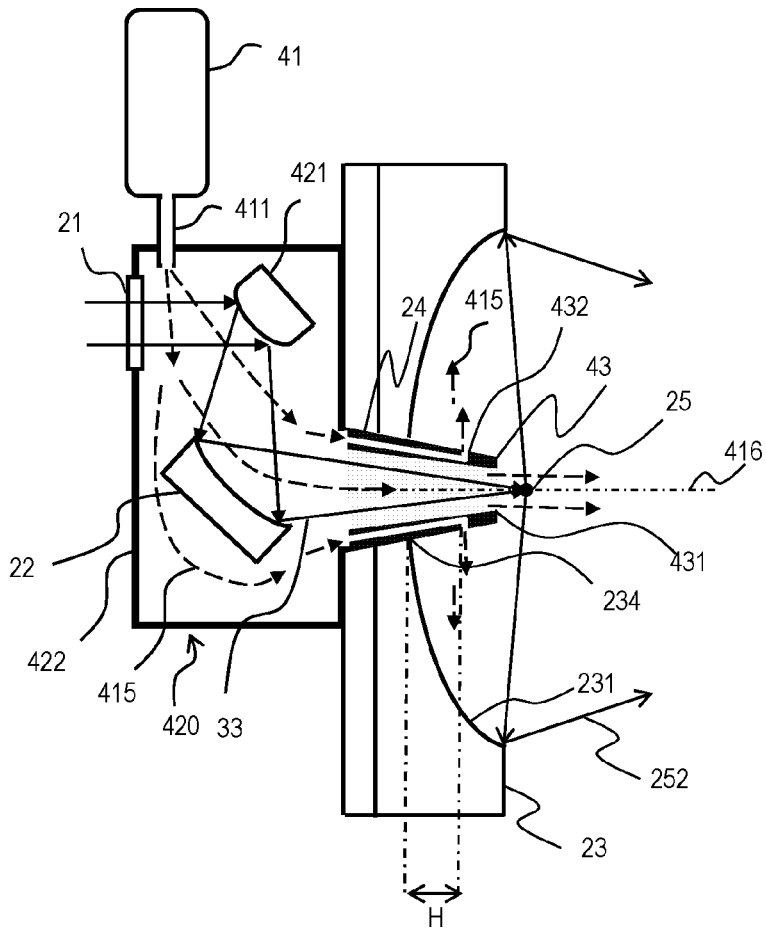
FIG. 7 is a cross-sectional diagram of a partial configuration of an EUV light generation apparatus of the first embodiment.

FIG. 7 is a cross-sectional diagram of a partial configuration of an EUV light generation apparatus of the first embodiment. Hereinafter, differences from the comparative example shown in FIG. 2 are mainly described.

Configuration

The gas ejection opening 432 of the cone 43 may be provided at a specific distance H away from the reflective surface 231 in the direction of outputting EUV light along the focal axis 416. The distance between the reflective surface 231 and the gas ejection opening 432 may be the shortest distance between the outlet edge 234 of the through-hole 24 and the gas ejection opening 432 in the direction of the focal axis 416. Hereinafter, the part where the distance between the outlet edge 234 and the gas ejection opening 432 is the smallest is referred to as the lower edge of the gas ejection opening 432. The lower edge of the gas ejection opening 432 may be defined by a circumference.

In the configuration described hereinafter, the outlet edge 234 of the through-hole 24 may be located on a plane perpendicular to the focal axis 416. The example provided herein uses the lower edge of the gas ejection opening 432 as a reference, but any other point may be used as the reference.

The cone 43 is a hydrogen gas ejection device. Specifically, the lower edge of the gas ejection opening 432 may be located at 2.7 mm from the reflective surface 231. This configuration is obtained by translating the gas ejection opening 432 in the configuration of FIG. 2 in the direction of outputting EUV light along the focal axis 416 of the EUV light collector mirror 23 by +2 mm. Although the hydrogen gas is supplied from the hydrogen gas source 41 to the gas channel 436 through the tube 411 and the space in the casing 422 in this example, the hydrogen gas may be supplied directly from the hydrogen gas source 41 to the gas channel 436 using a different tube.

Effects

Figure 8:
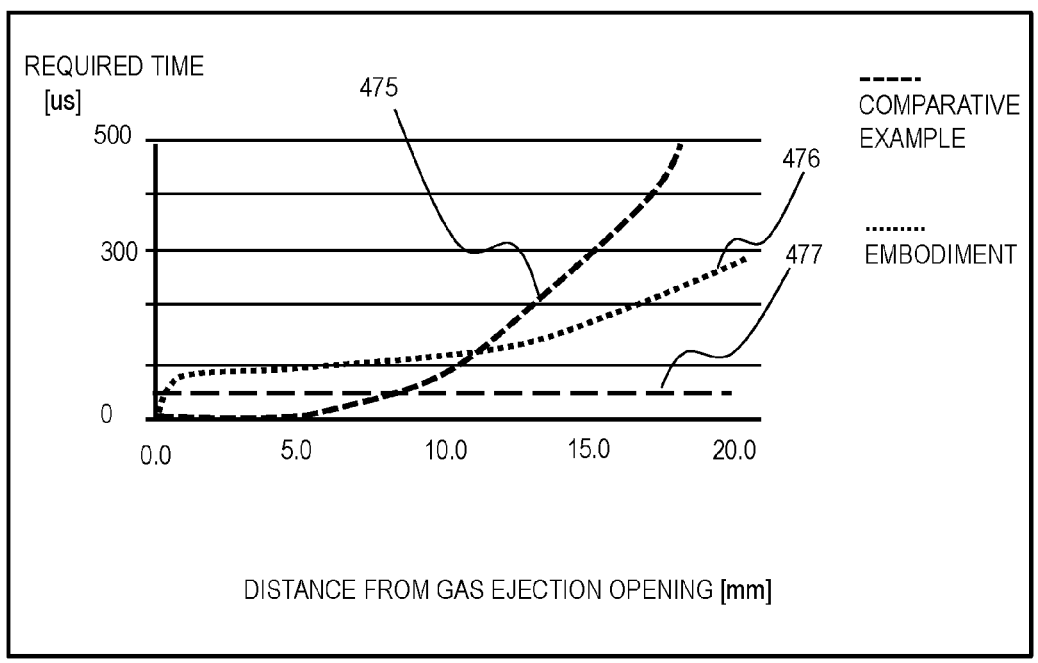
FIG. 8 shows results of simulations. The horizontal axis represents the distance from the gas ejection opening of the cone on the reflective surface of the EUV light collector mirror. The vertical axis represents the time for hydrogen gas ejected from the gas ejection opening to reach the position of the horizontal axis.

Hereinafter, effects of the EUV light generation apparatus in the present embodiment is described based on FIGS. 8 to 10. FIG. 8 shows results of simulations using the configuration of the comparative example and the configuration of the present embodiment. The horizontal axis represents the distance from the gas ejection opening 432 of the cone 43 on the reflective surface 231 of the EUV light collector mirror 23. Specifically, the horizontal axis represents the distance from the gas ejection opening 432 along the direction perpendicular to the focal axis 416 at a position on the EUV light collector mirror 23. The vertical axis represents the time for hydrogen gas ejected from the gas ejection opening 432 to reach the position of the horizontal axis (hereinafter, this time is also referred to as gas reaching time).

In FIG. 8, the line 475 represents the simulation result of hydrogen gas flow under the configuration of the comparative example; the line 476 represents the simulation result of hydrogen gas flow under the configuration of the present embodiment. The line 477 represents the EUV light emission cycle TI. For example, the EUV light emission cycle TI may be 50 µs. In other words, the EUV light emission frequency may be 20 kHz.

According to the result of simulation using the configuration of the comparative example, the gas reaching time is shorter than the EUV light emission cycle TI in the area within 8 mm from the gas ejection opening 432. Accordingly, in this area, the density of the hydrogen radical gas may drop sharply when the hydrogen gas ejected upon generation of EUV light from the gas ejection opening 432 reaches there, like at Point A in FIGS. 5 and 6. That is to say, the reflective surface 231 may intermittently contact with hydrogen radical gas in the area within 8 mm from the gas ejection opening 432.

According to the result of simulation using the configuration of the present embodiment, the gas reaching time is shorter than the EUV light emission cycle TI in the area within 1 mm from the gas ejection opening 432. That is to say, the reflective surface 231 may intermittently contact with hydrogen radical gas in the area within 1 mm from the gas ejection opening 432, which is narrower than that in the configuration of the comparative example.

The transition of the state of the gas will be described based on FIGS. 9 and 10. FIG. 9 illustrates a correspondence relation between the output timing of EUV light and the state of the gas on the reflective surface of the EUV light collector mirror in the EUV light generation apparatus of the first embodiment. FIG. 9 shows that the state changes from the top row (a) to the middle row (b), and further to the bottom row (c) with passage of time like FIG. 5. FIG. 10 illustrates correspondence relations between the density of hydrogen radical gas at Point A and Point B in FIG. 9 and the emission timing of EUV light. Like in FIG. 6, the horizontal axis represents the time and the vertical axis represents the power of EUV light and the density of hydrogen radical gas. Specifically, the line 472 represents the variation in power of the EUV light; the line 473 represents the variation in density of hydrogen radical gas at Point A; and the line 474 represents the variation in density of hydrogen radical gas at Point B.

Figure 9:
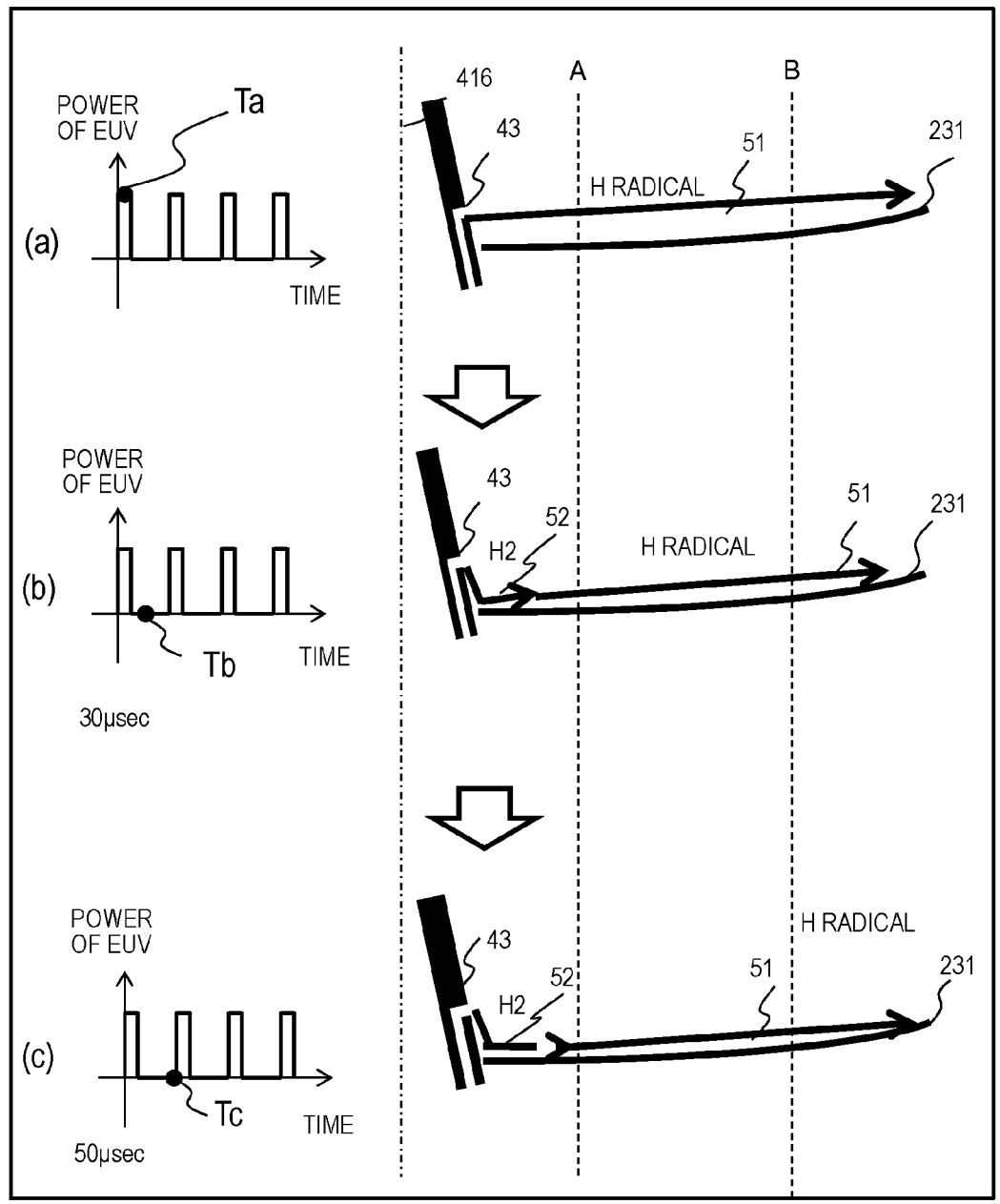
FIG. 9 illustrates a correspondence relation between the output timing of EUV light and the state of the gas on the reflective surface of the EUV light collector mirror in an EUV light generation apparatus of the first embodiment.
Figure 10:
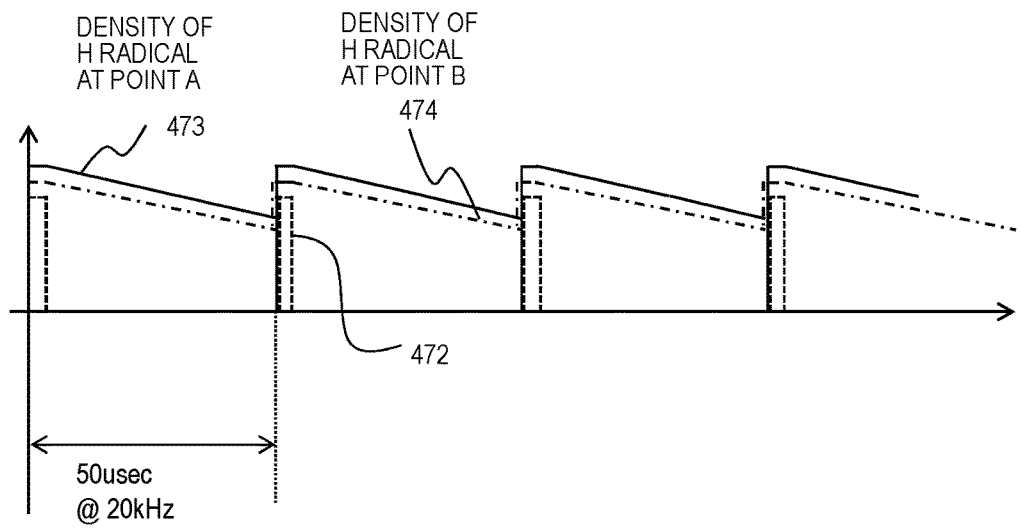
FIG. 10 illustrates correspondence relations between the density of hydrogen radical gas at Point A and Point B in FIG. 9 and the emission timing of EUV light.

The top row (a) in FIG. 9 shows the state at a time Ta in outputting EUV light. At the time Ta, EUV light is being generated, so that hydrogen radical gas 51 may be generated all over the reflective surface 231 of the EUV light collector mirror 23. The entire surface of the reflective surface 231 of the EUV light collector mirror 23 may be subjected to the etching by the hydrogen radical gas 51.

The middle row (b) in FIG. 9 shows the state at a time Tb in outputting EUV light. At the time Tb, EUV light may not be generated. Since the EUV light is pulses, stop of the EUV light may stop the generation of hydrogen radical gas as well. The flow of hydrogen gas 52 from the gas ejection opening 432 of the cone 43 may move the hydrogen radical gas 51 already generated on the reflective surface 231 toward the periphery of the reflective surface 231. However, unlike the middle row (b) in FIG. 5, unradicalized hydrogen gas 52 does not reach Point A in the central area; accordingly, wide area of the reflective surface 231 of the EUV light collector mirror 23 may be subjected to etching by the hydrogen radical gas 51.

The bottom row (c) in FIG. 9 shows the state at a time Tc in outputting EUV light. At the time Tc, EUV light may not be generated yet. Hydrogen radical gas may not be generated in the central area of the reflective surface 231 until EUV light is generated again. The hydrogen gas 52 and the hydrogen radical gas 51 on the reflective surface 231 may further move toward the periphery of the reflective surface 231. However, unlike the bottom row (c) in FIG. 5, unradicalized hydrogen gas 52 does not reach Point A in the central area even at the time Tc. Accordingly, area including Point A in the central area of the reflective surface 231 of the EUV light collector mirror 23 may be subjected to etching by the hydrogen radical gas 51.

As described above, the gas flow on the reflective surface 231 of the EUV light collector mirror 23 may repeat the states of the top row (a), the middle row (b), and the bottom row (c) of FIG. 9 when the EUV light generation apparatus 1 is operating. As a result, hydrogen radical gas 51 may be supplied not intermittently but continuously to the central area of the reflective surface 231 near the cone 43, except for the area within 1 mm from the gas ejection opening 432.

For example, in the case where the EUV light emission frequency is 20 kHz, the EUV light emission cycle may be 50 µs. Now, assume that the hydrogen gas ejected from the gas ejection opening 432 after emission of an EUV light pulse takes 50 µs or more to reach Point A in FIG. 10. In this case, the hydrogen gas that has not been radicalized may be radicalized before reaching Point A in the central area because of the next generation of EUV light. Accordingly, hydrogen radical gas 51 may be supplied to Point A in the central area not intermittently but continuously.

In FIG. 8, the line 476 shows less variation in gradient of the curve than the line 475. This may indicate that the configuration of the present embodiment is superior to the configuration of the comparative example in maintaining a desired gas-flow velocity at a position away from the gas ejection opening 432 on the reflective surface 231.

As understood from the above, the etching rate of the debris on the reflective surface 231 of the EUV light collector mirror 23 may be maintained by providing the gas ejection opening 432 at an appropriate position.

Specific Examples

Figure 11:
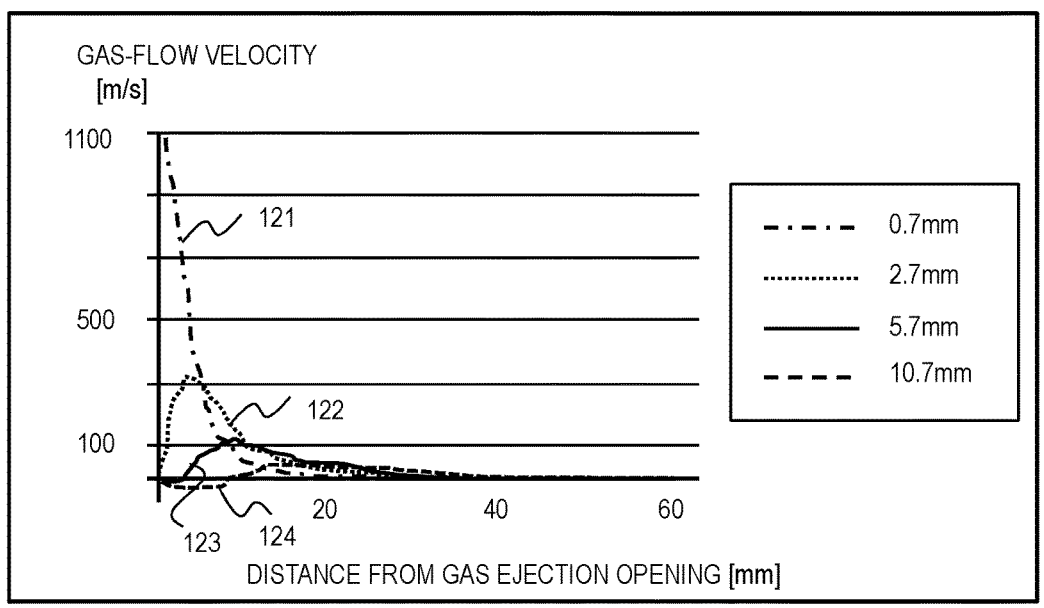
FIG. 11 shows results of simulations of the distribution of the gas-flow velocity on the reflective surface with gas ejection openings at different positions.
Figure 12A:
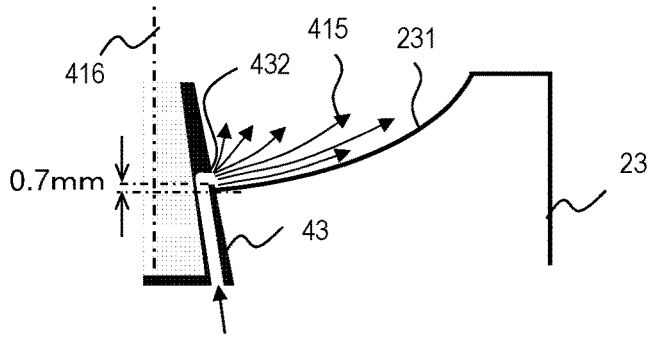
FIG. 12A schematically illustrates flux of hydrogen gas in a simulation shown in FIG. 11.
Figure 12B:
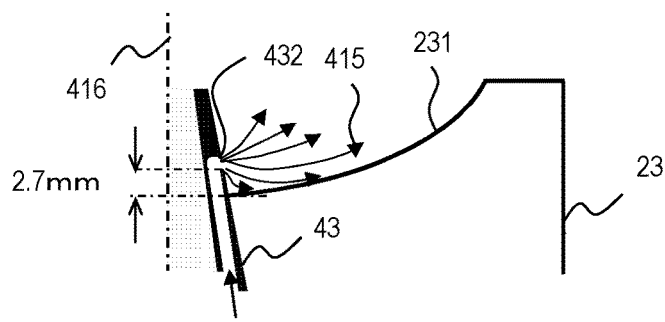
FIG. 12B schematically illustrates flux of hydrogen gas in a simulation shown in FIG. 11.
Figure 12C:
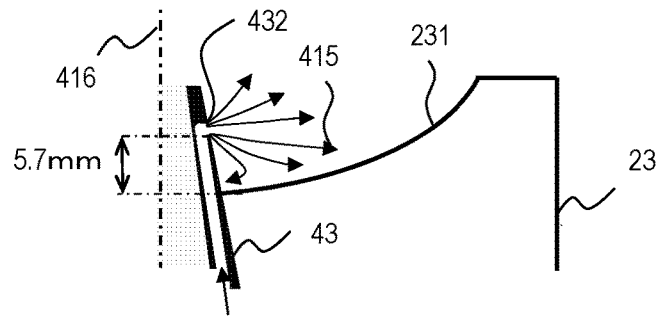
FIG. 12C schematically illustrates flux of hydrogen gas in a simulation shown in FIG. 11.
Figure 12D:
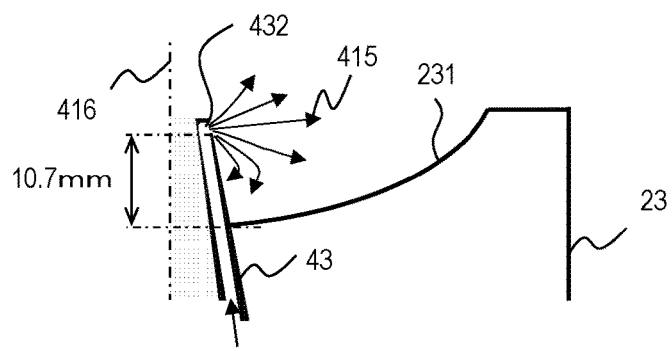
FIG. 12D schematically illustrates flux of hydrogen gas in a simulation shown in FIG. 11.

FIG. 11 shows results of simulations of the distribution of gas-flow velocity on the reflective surface 231 with gas ejection openings at different positions. In FIG. 11, the horizontal axis represents the distance on the reflective surface 231 of the EUV light collector mirror 23 from the gas ejection opening 432 and the vertical axis represents the gas-flow velocity.

The lines 121 to 124 represent simulation results with gas ejection openings at different positions. Specifically, the lines 121, 122, 123, and 124 represent simulation results with gas ejection openings positioned at 0.7 mm, 2.7 mm, 5.7 mm, and 10.7 mm, respectively. The values are the distance H between the gas ejection opening 432 and the reflective surface 231. As described above, the distance H may be the distance between the lower edge of the gas ejection opening 432 and the outlet edge 234 of the through-hole 24 in the direction of the focal axis 416 of the EUV light collector mirror 23.

In the simulations, the size of the gas ejection opening 432 may be 0.5 mm in the direction of outputting EUV light.

Compared to the comparative example of 0.7 mm, the gas-flow velocity in the central area of the reflective surface may be lowered and improved with each of the gas ejection openings positioned at 2.7 mm, 5.7 mm, and 10.7 mm. With the gas ejection opening positioned at 10.7 mm, a little fall of the velocity was observed in the central area of the reflective surface, which may indicate generation of a swirl.

FIGS. 12A to 12D schematically illustrate the flux of hydrogen gas in the simulations shown in FIG. 11. In the case of the gas ejection opening positioned at 5.7 mm, flux returning to the cone 43 may be generated. In the case of the gas ejection opening positioned at 10.7 mm, flux returning to the cone 43 may increase to generate a swirl. However, this configuration may be employable because the swirl is generated in a limited range. The position of the gas ejection opening may be determined so as to avoid the generation of a swirl. Then, more uniform flow of hydrogen radical gas may be achieved over the reflective surface 231.

The gas ejection opening may be positioned in the range of not less than 2.7 mm and not more than 10.7 mm from the reflective surface 231 of the EUV light collector mirror 23 in the direction of outputting EUV light. Effective etching may be achieved with this range. Giving a geometrical tolerance of plus/minus 0.2 mm, the gas ejection opening may be positioned in the range of not less than 2.5 mm and not more than 10.9 mm. To avoid generation of a swirl, the gas ejection opening may be positioned in the range not less than 2.5 mm but less than 5.5 mm.

Modified Examples

Hereinafter, modified examples of the hydrogen gas ejection device in the present embodiment are described. Described hereinafter are mainly differences from the above-described cone 43.

Modified Example 1

Figure 13:
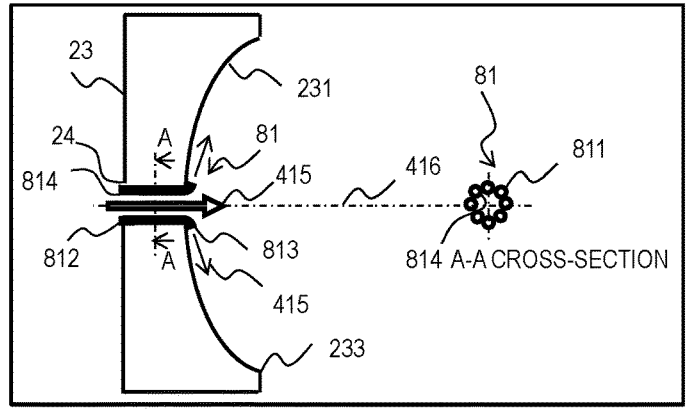
FIG. 13 illustrates a configuration example of a hydrogen gas ejection device in Modified Example 1 of the first embodiment.

FIG. 13 illustrates a hydrogen gas ejection device 81 in Modified Example 1. The hydrogen gas ejection device 81 may include a plurality of nozzles 811. The plurality of nozzles 811 may extend through the through-hole 24 of the EUV light collector mirror 23. In the through-hole 24, the plurality of nozzles 811 may be disposed on the outer surface of the through-hole 24 (wall surface of the EUV light collector mirror 23 surrounding the through-hole 24) to surround the center of the through-hole 24. A laser beam 33 and hydrogen gas may pass through the space 814 surrounded by the plurality of nozzles 811.

Each nozzle 811 may have a gas inlet 812 and a gas ejection opening 813. The gas inlet 812 may be exposed to the inside of the casing 422 of the laser beam focusing unit 420. The gas ejection opening 813 may be exposed to the inside of the chamber 2. Each nozzle 811 may be bent in the vicinity of the gas ejection opening 813. The gas ejection openings 813 of the nozzles 811 may be pointed in the direction along the reflective surface 231.

The lower ends of the gas ejection openings 813 of the plurality of nozzles 811 may be located on a plane perpendicular to the focal axis 416 of the EUV light collector mirror 23. The gas ejection openings 813 of the plurality of nozzles 811 may have the same shape, for example, a circle. The gas ejection openings 813 of the plurality of nozzles 811 may be equally distant from the focal axis 416 of the EUV light collector mirror 23. The spacing between gas ejection openings 813 of the nozzles 811 may be uniform in the circumferential direction.

The hydrogen gas 415 may flow from the casing 422 into the chamber 2 through the space 814. The hydrogen gas 415 may also flow into the chamber 2 through the gas inlets 812 and the gas ejection openings 813 of the nozzles 811. The gas ejection openings 813 may eject hydrogen gas onto the reflective surface 231. The hydrogen gas ejected from the gas ejection openings 813 may flow over the reflective surface 231 radially toward the periphery of the reflective surface 231. Modified Example 1 may facilitate the setup and the production of the hydrogen gas ejection device.

Modified Example 2

Figure 14:
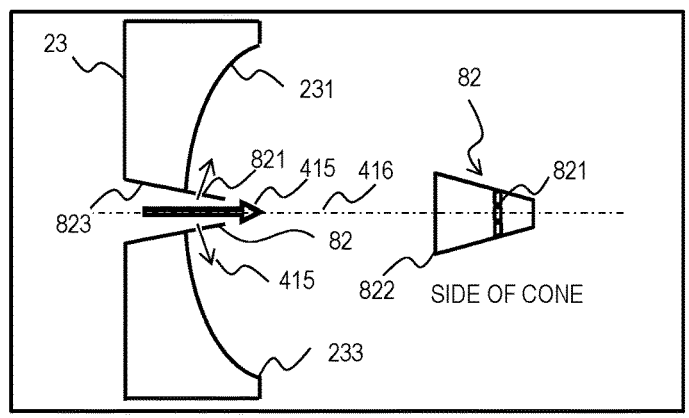
FIG. 14 illustrates a configuration example of a hydrogen gas ejection device in Modified Example 2 of the first embodiment.

FIG. 14 illustrates a hydrogen gas ejection device 82 in Modified Example 2. The hydrogen gas ejection device may be a cone 82 having a plurality of openings 821 in the side wall as gas ejection openings. The gas ejection openings 821 may be provided proportionally in the circumferential direction. The gas ejection openings 821 may be exposed to the inside of the chamber 2. The cone 82 may have a single wall 822; the gas ejection openings 821 may be formed in the single wall 822. Like the cone 43, the cone 82 may have a central through-hole 823. One end of the through-hole 823 may be exposed to the inside of the casing 422 of the laser beam focusing unit 420 and the other end may be exposed to the inside of the chamber 2.

The hydrogen gas 415 may flow from the casing 422 into the chamber 2 through the through-hole 823. Part of the hydrogen gas 415 may flow into the chamber 2 through the gas ejection openings 821. The gas ejection openings 821 may eject hydrogen gas onto the reflective surface 231. The hydrogen gas 415 ejected from the gas ejection openings 821 may flow over the reflective surface 231 radially toward the periphery of the reflective surface 231. Modified Example 2 may facilitate the setup and the production of the hydrogen gas ejection device and further, achieve less total flow of hydrogen gas.

Modified Example 3

Figure 15:
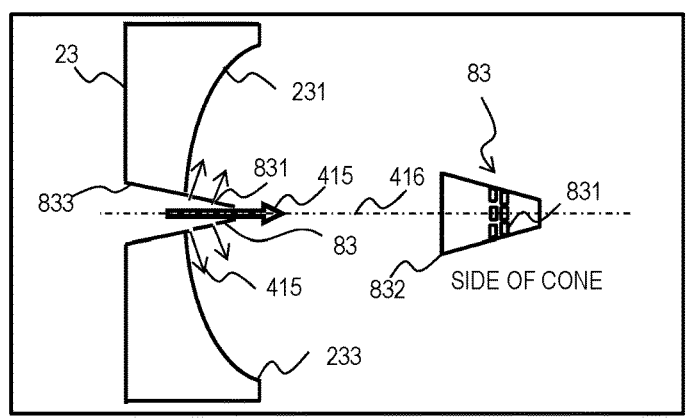
FIG. 15 illustrates a configuration example of a hydrogen gas ejection device in Modified Example 3 of the first embodiment.

FIG. 15 illustrates a hydrogen gas ejection device 83 in Modified Example 3. The hydrogen gas ejection device 83 may be a cone having a plurality of openings 831 in the side wall as gas ejection openings. The openings 831 may be provided in rows in the direction of outputting EUV light. The gas ejection openings 831 in each row may be provided proportionally in the circumferential direction. The gas ejection openings 831 may be exposed to the inside of the chamber 2.

The cone 83 may have a single wall 832; the gas ejection openings 831 may be formed in the single wall 832. Like the cone 43, the cone 83 may have a central through-hole 833. One end of the through-hole 833 may be exposed to the inside of the casing 422 of the laser beam focusing unit 420 and the other end may be exposed to the inside of the chamber 2.

The hydrogen gas 415 may flow from the casing 422 into the chamber 2 through the through-hole 833. Part of the hydrogen gas 415 may flow into the chamber 2 through the gas ejection openings 831. The gas ejection openings 831 may eject hydrogen gas onto the reflective surface 231. The hydrogen gas 415 ejected from the gas ejection openings 831 may flow over the reflective surface 231 radially toward the periphery of the reflective surface 231.

The amount of gas may be adjusted easily by adjusting the area of the gas ejection openings 831 in each row to form more ideal gas flow. It should be noted that the reference for the foregoing position of the gas ejection opening may be the positions of the gas ejection openings in the lowest row among the plurality of rows of gas ejection openings.

6. Second Embodiment

Design Method

Figure 16:
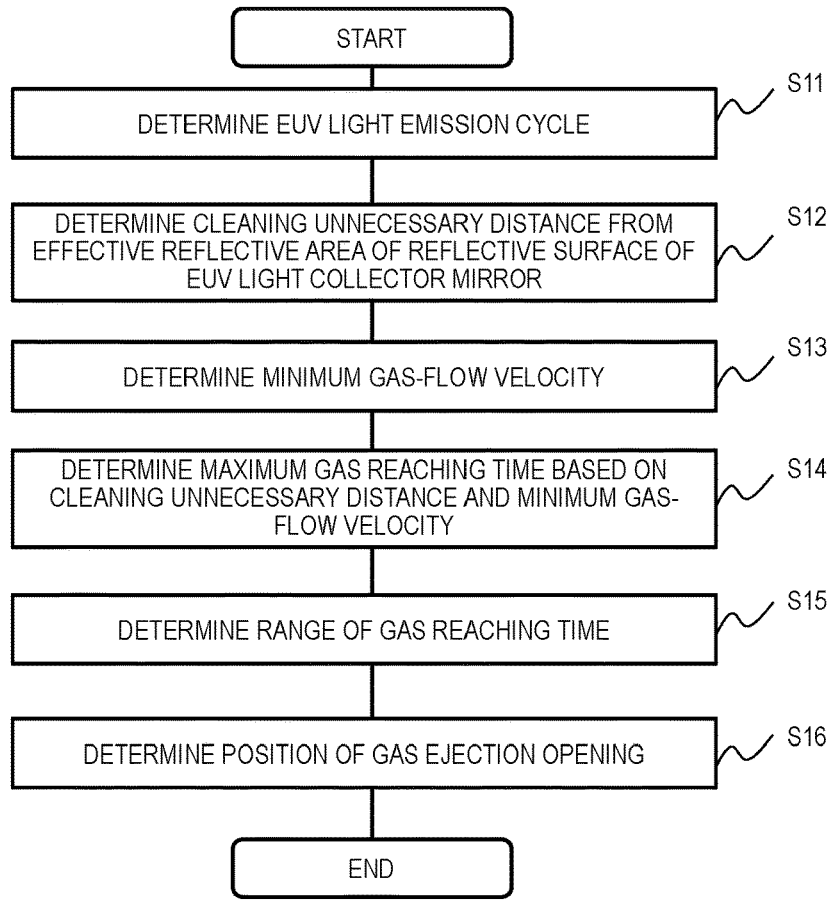
FIG. 16 is a flowchart of a design method in the second embodiment.
Figure 17:
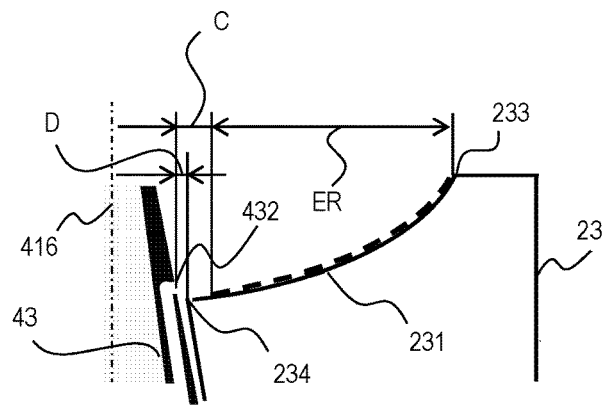
FIG. 17 illustrates an example of a configuration to which the design method in the second embodiment is to be applied.

The configuration described in the first embodiment may be a good example of the position of the gas ejection opening determined in accordance with the design method of the inventors. Hereinafter, the design method is described as the second embodiment. FIG. 16 is a flowchart of the design method in the present embodiment. FIG. 17 illustrates an example of a configuration to which the design method of the present embodiment is to be applied.

First, the method may determine the EUV light emission cycle TI (S11). The EUV light emission cycle TI may be obtained by inverting the EUV light emission frequency R. That is to say, $$TI = 1/R \qquad (1)$$

For example, the EUV light emission frequency R may be 20 kHz; then, the EUV light emission cycle TI may be calculated as 50 μs.

Next, the method may determine the cleaning unnecessary distance C from the effective reflective area ER of the reflective surface 231 of the EUV light collector mirror 23 (S12). The effective reflective area ER may be the area that reflects EUV light to be used by the exposure apparatus 6 in the reflective surface 231 of the EUV light collector mirror 23. The effective reflective area ER may be determined based on the shape of the EUV light collector mirror 23 and the reasons of issues in manufacturing.

In the example of FIG. 17, since the EUV light collector mirror 23 has a through-hole 24, the inside of the through-hole 24 may not be used for exposure. Furthermore, the area within 5 mm from the outlet edge 234 of the through-hole 24 may not be used by the exposure apparatus 6 for reasons of issues in manufacturing the EUV light collector mirror 23, such as difficulty in attaining flatness of the reflective surface 231 and difficulty in coating with a reflective film.

Accordingly, the method may determine the area within 5 mm from the outlet edge 234 of the through-hole 24 in the reflective surface 231 to be the cleaning unnecessary area and the area down to a peripheral end 233 of the reflective surface 231 excluding the cleaning unnecessary area to be the effective reflective area ER of the reflective surface 231.

In the example of FIG. 17, the distance D between the gas ejection opening 432 and the outlet edge 234 of the through-hole 24 may be 1 mm. Accordingly, defining the sum of the distance D and the distance from the outlet edge 234 of the through-hole 24 in the cleaning unnecessary area as cleaning unnecessary distance C, the method may determine the cleaning unnecessary distance C to be not more than 6 mm from the gas ejection opening 432. The method may determine the cleaning unnecessary distance C to be 6 mm from the gas ejection opening 432. The cleaning unnecessary distance C may be defined based on the center of the gas ejection opening 432 in the direction of the focal axis. If the cleaning unnecessary distance C varies with the direction of gas flow, for example, the shortest cleaning unnecessary distance C may be employed.

The cleaning unnecessary distance C may be determined based on another reference. For example, in a configuration where the entire area of the reflective surface 231 is the area to reflect EUV light to be used by the exposure apparatus 6, the cleaning unnecessary distance C may be determined based on the percentage of clean reflective area in the EUV light collector mirror 23.

FIG. 18 shows simulation results about the relation between the cleaning unnecessary distance C from the gas ejection opening 432 and the percentage of the clean reflective area with respect to the entire area of the reflective surface 231. In the example of FIG. 18, the entire area of the EUV light collector mirror 23 ranging from the outlet edge of the through-hole 24 to the peripheral end 233 may reflect EUV light to be used by the exposure apparatus 6 as described above. In FIG. 18, the position at 1 mm for the cleaning unnecessary distance C may correspond to the outlet edge 234 of the through-hole 24. The distance D between the gas ejection opening 432 and the outlet edge 234 of the through-hole 24 may be 1 mm.

According to the example of FIG. 18, when the cleaning unnecessary distance C is 5 mm, the clean reflective area may be higher than 99%. Accordingly, the method may determine the cleaning unnecessary distance C from the gas ejection opening 432 to be 5 mm, for example.

Returning to FIG. 16, the method may determine the minimum flow velocity (S13). To sufficiently make the etching gas react to the debris, it may be preferable that hydrogen radical gas contact with the reflective surface for a longer time and therefore, it may be preferable that the velocity of the etching gas flow be lower. In the meanwhile, it may be preferable to remove the stannane to prevent new deposition of debris and supply unreacted hydrogen radical gas to the reflective surface 231. Furthermore, it may be important to make the hydrogen radical gas unfailingly reach the periphery of the effective reflective area ER.

In view of the foregoing issues, it may be important to produce flow of hydrogen radical gas having a certain velocity over the reflective surface 231. For this reason, the minimum flow velocity may be defined for the hydrogen gas. The minimum flow velocity may be determined by simulation or experiment.

For example, the measurement results shown in FIG. 4 teach that effective etching effect can be obtained at a position of 60 mm or more, for example 100 mm, from the center of the reflective surface 231. The simulation about the distribution of flow velocity under the configuration of FIG. 2 teaches that the gas-flow velocity at the position of 100 mm from the center of the reflective surface 231 is 100 mm/s. Accordingly, the minimum flow velocity Vc in the present example may be determined to be 100 mm/s.

The flow velocity may be defined as the average velocity of the main flow. The minimum flow velocity may be defined by another method. For example, the average value or the smallest value of the velocities at a plurality of positions where effective etching effect is observed may be determined to be the minimum flow velocity.

Next, the method may determine a maximum gas reaching time Tmax based on the cleaning unnecessary distance C and the minimum flow velocity (S14). The time taken by hydrogen gas supplied from the gas ejection opening 432 at the minimum flow velocity to travel by the cleaning unnecessary distance C may be defined as the maximum gas reaching time Tmax. The maximum gas reaching time Tmax may be given by the following formula (2):

$$T\max = C \text{ [mm]}/Vc \text{ [mm/s]} \tag{2}$$

In the present example, the maximum gas reaching time Tmax may be determined to be 60 ms.

Next, the method may determine the range for the gas reaching time Tg (S15). The time required for the hydrogen gas supplied from the gas ejection opening 432 to reach the cleaning unnecessary distance C may be defined as gas reaching time Tg. To achieve effective etching on the reflective surface 231, the gas reaching time Tg may be longer than an EUV light emission cycle TI. This condition may correspond to the condition that, in the bottom row (c) in FIG. 9, the hydrogen gas does not reach Point A immediately before the next emission of EUV light pulse. Under this condition, Point A may be exposed to hydrogen radical gas in the intervals of pulses of EUV light.

The gas reaching time Tg may be shorter than the maximum gas reaching time Tmax. Unless this condition is satisfied, sufficient gas-flow velocity might not be attained on the effective reflective area ER.

Accordingly, the method may determine the gas reaching time Tg to satisfy the following formula (3). It may be considered that the formula (3) defines the maximum value and the minimum value for the average gas-flow velocity on the cleaning unnecessary area.

$$TI < Tg < T\max \tag{3}$$

In the present example, the relation of the following formula (4) may be satisfied:

$$50 \text{ }\mu s < Tg < 60 \text{ ms} \tag{4}$$

Next, the method may determine the position for the gas ejection opening 432 so that the gas reaching time Tg satisfies the foregoing formula (3), based on the measurement and/or simulation (S16). For example, the simulation illustrated in FIG. 8 may be conducted to determine the position for the gas ejection opening 432 in the range where the gas reaching time Tg satisfies the foregoing formula (3). At this step, only the minimum value for the gas reaching time Tg may be used.

The method may determine candidate positions for the gas ejection opening 432 within the range where the gas reaching time Tg satisfies only the condition on the minimum value and select one of the candidate positions through experiments on deposition of debris.

The method may determine the position for the gas ejection opening 432 based on the gas-flow velocity on the effective reflective area ER. For example, the position for the gas ejection opening 432 may be determined to satisfy the conditions that the gas reaching time Tg is longer than the EUV light emission cycle TI and that the gas-flow velocity is higher than the minimum flow velocity at all points in the effective reflective area ER. The gas-flow velocity may be acquired by simulation or measurement. The minimum flow velocity may be determined from a parameter different from the gas reaching time.

The method may calculate the maximum flow velocity Vmax based on the cleaning unnecessary distance C to specify the maximum value and the minimum value for the average gas-flow velocity Vg on the cleaning unnecessary area. For example, the flow velocity of the hydrogen radical gas that travels the cleaning unnecessary distance C in an EUV light emission cycle TI may be defined as maximum flow velocity Vmax. In this case, $$V\max = C \text{ [m]}/TI \text{ [s]} \tag{5}$$

may be given and in the present example, the maximum flow velocity Vmax may be determined to be 120 m/s. Based on this, $$Vc < Vg < V\max \tag{6}$$

may be specified.

In the present example, the relation of the following formula (7) may be satisfied:

$$100 \text{ mm/s} < Vg < 120 \text{ m/s} \tag{7}$$

The position for the gas ejection opening 432 may be determined so that the average gas-flow velocity Vg satisfies the foregoing formula (7), based on measurement and/or simulation.

As set forth above, the present invention has been described with reference to embodiments. However, the scope of the present invention is not limited to the above-described embodiments. A part of the configuration of an embodiment may be replaced with a configuration of another embodiment. A configuration of an embodiment may be incorporated to a configuration of another embodiment. A part of the configuration of each embodiment may be removed, added with a different configuration, or replaced by a different configuration.

The terms used in this specification and the appended claims should be interpreted as "non-limiting". For example, the terms "include" and "be included" should be interpreted as "including the stated elements but not limited to the stated elements". The term "have" should be interpreted as "having the stated elements but not limited to the stated elements". Further, the modifier "one (a/an)" should be interpreted as "at least one" or "one or more."

What is claimed is:

1. An extreme ultraviolet light generation apparatus comprising:
    a chamber;
    a target supply device configured to successively supply targets into the chamber;
    an extreme ultraviolet light collector mirror including a reflective surface having a through-hole at the center thereof, the reflective surface being configured to reflect and collect extreme ultraviolet light generated at a predetermined emission cycle because of irradiation of the successively supplied targets with a laser beam; and
    a gas ejection device disposed in the through-hole to jut out from the reflective surface and having a gas ejection opening to eject etching gas for debris onto the reflective surface, the gas ejection device being configured so that the etching gas takes a longer time than the predetermined emission cycle to reach the through-hole-side end of effective reflective area of the reflective surface after being ejected from the gas ejection opening.

2. The extreme ultraviolet light generation apparatus according to claim 1, wherein a distance between the end of the effective reflective area and an edge of the opening of the through-hole is substantially 5 mm.

3. The extreme ultraviolet light generation apparatus according to claim 1, wherein the distance from the reflective surface to the gas ejection opening in a direction of a focal axis of the extreme ultraviolet light collector mirror is not less than 2.5 mm and not more than 10.9 mm.

4. The extreme ultraviolet light generation apparatus according to claim 1, wherein the distance from the reflective surface to the gas ejection opening in a direction of a focal axis of the extreme ultraviolet light collector mirror is substantially 2.7 mm.

5. A method of designing an extreme ultraviolet light generation apparatus including a gas ejection device disposed at a center of a reflective surface of an extreme ultraviolet light collector mirror and configured to eject etching gas for debris onto the reflective surface, the method comprising:
  determining an emission cycle of extreme ultraviolet light;
  determining an effective reflective area configured to reflect extreme ultraviolet light to be used for exposure, in the reflective surface;
  determining a cleaning unnecessary distance from a gas ejection opening formed in the gas ejection device and configured to eject the etching gas onto the reflective surface to the effective reflective area; and
  determining a position for the gas ejection opening based on a time required for the etching gas to travel the cleaning unnecessary distance from the gas ejection opening and the emission cycle.

6. The method according to claim 5, further comprising determining a minimum flow velocity for the etching gas, wherein the position for the gas ejection opening is determined based on the required time, the emission cycle, and a time required for traveling the cleaning unnecessary distance at the minimum flow velocity.

7. The method according to claim 6,
  wherein the extreme ultraviolet light collector mirror has a through-hole at the center thereof,
  wherein the gas ejection device is a cone disposed in the through-hole to partially jut out from the reflective surface,
  wherein the gas ejection opening is formed in the outer face of the cone, and
  wherein the position for the gas ejection opening is determined by determining a distance from the reflective surface to the gas ejection opening in a direction of a focal axis of the extreme ultraviolet light collector mirror.

8. The method according to claim 5, wherein the position for the gas ejection opening is determined to satisfy a condition that a swirl of etching gas is not generated above the effective reflective area.

* * * * *